(12) United States Patent
Pakala et al.

(10) Patent No.: US 7,489,541 B2
(45) Date of Patent: Feb. 10, 2009

(54) SPIN-TRANSFER SWITCHING MAGNETIC ELEMENTS USING FERRIMAGNETS AND MAGNETIC MEMORIES USING THE MAGNETIC ELEMENTS

(75) Inventors: Mahendra Pakala, Fremont, CA (US); Eugene Youjun Chen, Fremont, CA (US); Yiming Huai, Pleasanton, CA (US)

(73) Assignee: Grandis, Inc., Milpitas, CA (US)

( * ) Notice: Subject to any disclaimer, the term of this patent is extended or adjusted under 35 U.S.C. 154(b) by 120 days.

(21) Appl. No.: 11/210,452

(22) Filed: Aug. 23, 2005

(65) Prior Publication Data

US 2007/0074317 A1    Mar. 29, 2007

(51) Int. Cl.
G11C 11/00 (2006.01)

(52) U.S. Cl. .................. 365/158; 365/157; 365/55; 365/56

(58) Field of Classification Search ................. 365/158, 365/157, 55, 56
See application file for complete search history.

(56) References Cited

U.S. PATENT DOCUMENTS

| | | | |
|---|---|---|---|
| 5,695,864 A | 12/1997 | Slonczewski | |
| 7,230,265 B2* | 6/2007 | Kaiser et al. | 365/173 |
| 2003/0198113 A1 | 10/2003 | Abraham et al. | |
| 2005/0007819 A1* | 1/2005 | Fukuzumi | 365/171 |
| 2005/0012129 A1* | 1/2005 | Saito | 257/296 |
| 2005/0040433 A1 | 2/2005 | Nozieres et al. | |
| 2005/0110004 A1* | 5/2005 | Parkin et al. | 257/30 |
| 2005/0184839 A1* | 8/2005 | Nguyen et al. | 335/173 |
| 2005/0185454 A1* | 8/2005 | Brown et al. | 365/171 |
| 2005/0185455 A1* | 8/2005 | Huai | 365/171 |
| 2005/0189574 A1* | 9/2005 | Nguyen et al. | 257/295 |
| 2005/0207070 A1* | 9/2005 | Carey et al. | 360/324.1 |
| 2007/0002503 A1* | 1/2007 | Sbiaa et al. | 360/324.11 |

OTHER PUBLICATIONS

Stuart S.P. Parkin, et al., *Giant tunnelling magnetoresistance at room temperature with MgO (100) tunnel barriers*, Nature Materials, Oct. 2004, pp. 1-6.

Yiming Huai, et al., *Spin-Transfer Switching Current Distribution and Reduction in Magnetic Tunneling Junction Based Structures*, Invite Paper, Intermag Conference, Nagoya, Apr. 2005, pp. 1-6.

J.Z. Sun, *Spin-current interaction with a monodomain magnetic body: A model study*, The American Physical Society, Physical Review B, vol. 62, No. 1, Jul. 2000, pp. 570-578.

Yiming Huai and Mahendra Pakala, *MTJ Elements with High Spin Polarization Layers Configured for Spin-Transfer Switching and Spintronics Devices Using the Magnetic Elements*, U.S. Appl. No. 11/027,397.

PCT International Search Report and Written Opinion of the International Searching Authority, issued Jul. 7, 2008, application No. PCT/US06/33093.

* cited by examiner

*Primary Examiner*—Thong Q Le
(74) *Attorney, Agent, or Firm*—Strategic Patent Group, P.C.

(57) ABSTRACT

A method and system for providing a magnetic element are disclosed. The method and system include providing a pinned layer, providing a spacer layer, and providing a free layer. The free layer is ferrimagnetic and includes at least one of a conductive ferrite, a garnet, a ferrimagnetic alloy excluding a rare earth, a heavy rare-earth-transition metal alloy, a half-metallic ferrimagnetic, and a bilayer. The bilayer includes a rare earth-transition metal alloy layer and a spin current enhancement layer. The magnetic element is configured to allow the free layer to be switched due to spin transfer when a write current is passed through the magnetic element.

33 Claims, 5 Drawing Sheets

SPIN-TRANSFER SWITCHING MAGNETIC ELEMENTS USING FERRIMAGNETS AND MAGNETIC MEMORIES USING THE MAGNETIC ELEMENTS

FIELD OF THE INVENTION

The present invention relates to magnetic memory systems, and more particularly to a method and system for providing a magnetic element that can be switched using a spin transfer effect at a lower switching current and magnetic memories using the magnetic element.

BACKGROUND OF THE INVENTION

Figure 1:
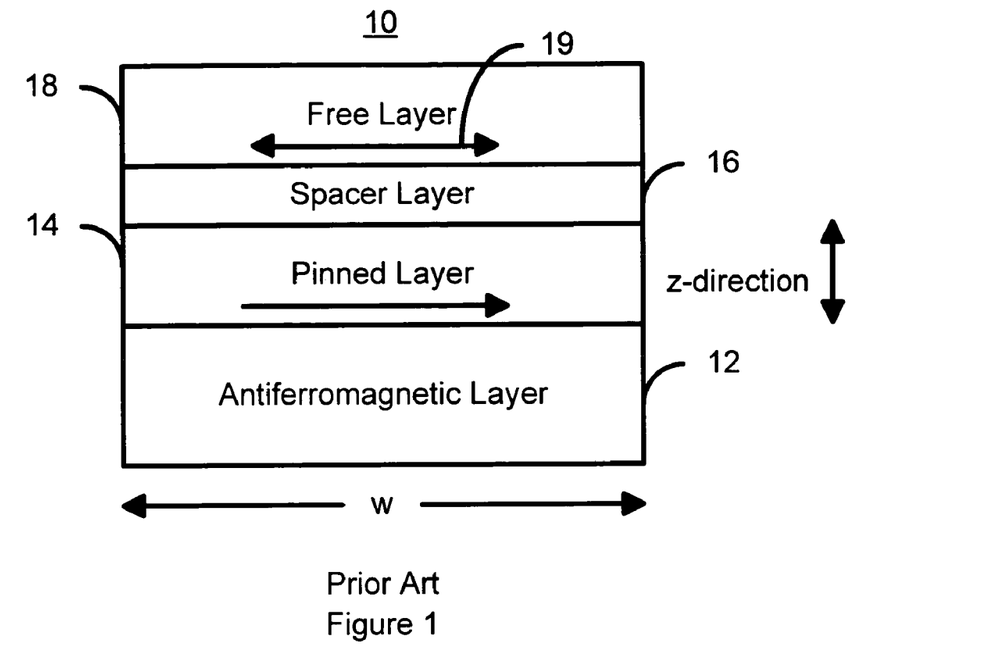
FIG. 1 is a diagram of a conventional magnetic element, a spin valve.
Figure 2:
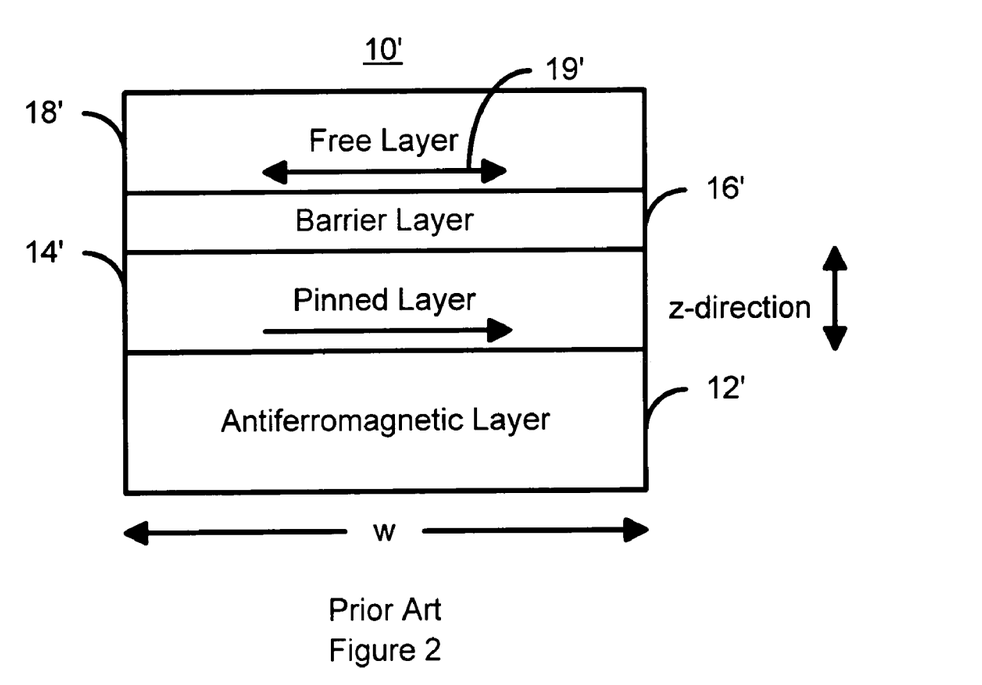
FIG. 2 is a diagram of another conventional magnetic element, a spin tunneling junction.

FIGS. 1 and 2 depict conventional magnetic elements 10 and 10'. Such conventional magnetic elements 10/10' can be used in non-volatile memories, such as magnetic random access memories (MRAM). The conventional magnetic element 10 is a spin valve and includes a conventional antiferromagnetic (AFM) layer 12, a conventional pinned layer 14, a conventional nonmagnetic spacer layer 16 and a conventional free layer 18. Other layers (not shown), such as seed or capping layer may also be used. The conventional pinned layer 14 and the conventional free layer 18 are ferromagnetic. Thus, the conventional free layer 18 is depicted as having a changeable magnetization 19. The conventional nonmagnetic spacer layer 16 is conductive. The AFM layer 12 is used to fix, or pin, the magnetization of the pinned layer 14 in a particular direction. The magnetization of the free layer 18 is free to rotate, typically in response to an external magnetic field. The conventional magnetic element 10' depicted in FIG. 2 is a spin tunneling junction. Portions of the conventional spin tunneling junction 10' are analogous to the conventional spin valve 10. However, the conventional barrier layer 16' is an insulator that is thin enough for electrons to tunnel through in a conventional spin tunneling junction 10'. Note that only a single spin valve 10 is depicted, one of ordinary skill in the art will readily recognize that dual spin valves including two pinned layers and two nonmagnetic layers separating the pinned layers from the free layer can be used. Similarly, although only a single spin tunneling junction 10' is depicted, one of ordinary skill in the art will readily recognize that dual spin tunneling including two pinned layers and two barrier layers separating the pinned layers from the free layer, can be used.

Depending upon the orientations of the magnetization 19/19' of the conventional free layer 18/18' and the conventional pinned layer 14/14', respectively, the resistance of the conventional magnetic element 10/10', respectively, changes. When the magnetization 19/19' of the conventional free layer 18/18' is parallel to the magnetization of the conventional pinned layer 14/14', the resistance of the conventional magnetic element 10/10' is low. When the magnetization 19/19' of the conventional free layer 18/18' is antiparallel to the magnetization of the conventional pinned layer 14/14', the resistance of the conventional magnetic element 10/10' is high.

To sense the resistance of the conventional magnetic element 10/10', current is driven through the conventional magnetic element 10/10'. Typically in memory applications, current is driven in a CPP (current perpendicular to the plane) configuration, perpendicular to the layers of conventional magnetic element 10/10' (up or down, in the z-direction as seen in FIG. 1 or 2). Based upon the change in resistance, typically measured using the magnitude of the voltage drop across the conventional magnetic element 10/10', the resistance state and, therefore, the data stored in the conventional magnetic element 10/10' can be determined.

It has been proposed that particular materials be used for the conventional magnetic element 10'. In such a conventional magnetic element 10', it has been proposed that ferromagnetic materials from the group of Ni, Co, and Fe, their alloys such as CoFe, CoFeNi, and low-moment ferromagnetic materials such as $CoFeB_x$, (where x is between five and thirty atomic percent), CoFeC, CoFeHf, or analogous materials be used for the pinned layer 14' and free layer 18'. In addition, U.S. Patent Application Publication 2005/0040433 (Noziere) proposes the use of certain rare earth-transition metal alloys, such as GdCo, for the free layer 18'. It is known that certain rare earth-transition metal alloys have certain compositions, termed the compensation point, at which the net saturation magnetization becomes zero at a particular temperature. For the conventional barrier layer 16', it has been proposed that amorphous $AlO_x$ or crystalline MgO having (100) or (111) texture be used. For such structures, a large magnetoresistance, up to a several hundred percent difference between the high and low resistance states, can be achieved.

Spin transfer is an effect that may be utilized to switch the magnetizations 19/19' of the conventional free layers 18/18', thereby storing data in the conventional magnetic elements 10/10'. Spin transfer is described in the context of the conventional magnetic element 10', but is equally applicable to the conventional magnetic element 10. The following description of the spin transfer phenomenon is based upon current knowledge and is not intended to limit the scope of the invention.

When a spin-polarized current traverses a magnetic multilayer such as the spin tunneling junction 10' in a CPP configuration, a portion of the spin angular momentum of electrons incident on a ferromagnetic layer may be transferred to the ferromagnetic layer. Electrons incident on the conventional free layer 18' may transfer a portion of their spin angular momentum to the conventional free layer 18'. As a result, a spin-polarized current can switch the magnetization 19' direction of the conventional free layer 18' if the current density is sufficiently high (approximately $10^7$-$10^8$ A/cm$^2$) and the lateral dimensions of the spin tunneling junction are small (approximately less than two hundred nanometers). In addition, for spin transfer to be able to switch the magnetization 19' direction of the conventional free layer 18', the conventional free layer 18' should be sufficiently thin, for instance, generally less than approximately ten nanometers for Co. Spin transfer based switching of magnetization dominates over other switching mechanisms and becomes observable when the lateral dimensions of the conventional magnetic element 10/10' are small, in the range of few hundred nanometers. Consequently, spin transfer is suitable for higher density magnetic memories having smaller magnetic elements 10/10'.

Spin transfer can be used in the CPP configuration as an alternative to or in addition to using an external switching field to switch the direction of magnetization of the conventional free layer 18' of the conventional spin tunneling junction 10'. For example, the magnetization 19' of the conventional free layer 18' can be switched from antiparallel to the magnetization of the conventional pinned layer 14' to parallel to the magnetization of the conventional pinned layer 14'. Current is driven from the conventional free layer 18' to the conventional pinned layer 14' (conduction electrons traveling from the conventional pinned layer 14' to the conventional free layer 18'). The majority electrons traveling from the conventional pinned layer 14' have their spins polarized in the same direction as the magnetization of the conventional pinned layer 14'. These electrons may transfer a sufficient portion of their angular momentum to the conventional free layer 18' to switch the magnetization 19' of the conventional free layer 18' to be parallel to that of the conventional pinned layer 14'. Alternatively, the magnetization of the free layer 18' can be switched from a direction parallel to the magnetization of the conventional pinned layer 14' to antiparallel to the magnetization of the conventional pinned layer 14'. When current is driven from the conventional pinned layer 14' to the conventional free layer 18' (conduction electrons traveling in the opposite direction), majority electrons have their spins polarized in the direction of magnetization of the conventional free layer 18'. These majority electrons are transmitted by the conventional pinned layer 14'. The minority electrons are reflected from the conventional pinned layer 14', return to the conventional free layer 18' and may transfer a sufficient amount of their angular momentum to switch the magnetization 19' of the free layer 18' antiparallel to that of the conventional pinned layer 14'.

Although spin transfer can be used in switching the magnetization 19/19' of the conventional free layer 18/18', one of ordinary skill in the art will readily recognize that a high current density is typically required. In particular, the current required to switch the magnetization 19/19' is termed the critical current. As discussed above, the critical current corresponds to a critical current density that is approximately at least $10^7$ A/cm$^2$. One of ordinary skill in the art will also readily recognize that such a high current density implies that a high write current and a small magnetic element size are necessary.

Use of a high critical current for switching the magnetization 19/19' adversely affects the utility and reliability of such conventional magnetic elements 10/10' in a magnetic memory. The high critical current corresponds to a high write current. The use of a high write current is associated with increased power consumption, which is undesirable. The high write current may require that larger structures, such as isolation transistors, be used with the conventional magnetic element 10/10' to form memory cells. Consequently, the areal density of such a memory is reduced. In addition, the conventional magnetic element 10', which has a higher resistance and thus a higher signal, may be less reliable because the conventional barrier layer 16' may be subject to dielectric breakdown at higher write currents. Thus, even though a higher signal read may be achieved, the conventional magnetic elements 10/10' may be unsuitable for use in higher density conventional MRAMs using a high spin transfer switching current to write to the conventional magnetic elements 10/10'. Moreover, although mechanisms for reducing the high current density have been proposed, such as in Noziere, these mechanisms have issues such as a potential loss in signal.

Accordingly, what is needed is a system and method for providing a magnetic memory element that can be switched using spin transfer at a lower write current. The present invention addresses such a need.

BRIEF SUMMARY OF THE INVENTION

The present invention provides a method and system for providing a magnetic element. The method and system comprise providing a pinned layer, providing a spacer layer, and providing a free layer. The free layer is ferrimagnetic and includes at least one of a conductive ferrite, a garnet, a ferrimagnetic alloy excluding a rare earth, a heavy rare-earth-transition metal alloy, a half-metallic ferrimagnet, and a bilayer. The bilayer includes a rare earth-transition metal alloy layer and a spin current enhancement layer. The magnetic element is configured to allow the free layer to be switched due to spin transfer when a write current is passed through the magnetic element.

According to the method and system disclosed herein, the present invention provides a magnetic element that can be written using spin transfer at a lower write current.

DETAILED DESCRIPTION OF THE INVENTION

The present invention relates to magnetic elements and magnetic memories such as MRAM. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein. The present invention is also described in the context of current knowledge for physical phenomenon. However, the present invention is not intended to be limited to specific explanations of physical phenomenon.

The present invention provides a method and system for providing a magnetic element. The method and system comprise providing a pinned layer, providing a spacer layer, and providing a free layer. The free layer is ferrimagnetic and includes at least one of a conductive ferrite, a garnet, a ferrimagnetic alloy excluding a rare earth, a heavy rare-earth-transition metal alloy, a half-metallic ferrimagnet, and a bilayer. The bilayer includes a rare earth-transition metal alloy layer and a spin current enhancement layer. The magnetic element is configured to allow the free layer to be switched due to spin transfer when a write current is passed through the magnetic element.

The present invention will be described in terms of a particular magnetic memory and a particular magnetic element having certain components. However, one of ordinary skill in the art will readily recognize that this method and system will operate effectively for other magnetic memory elements having different and/or additional components and/or other magnetic memories having different and/or other features not inconsistent with the present invention. The present invention is also described in the context of current understanding of the spin transfer phenomenon, as well as spin polarization due to interfaces with barrier layers. Consequently, one of ordinary skill in the art will readily recognize that theoretical explanations of the behavior of the method and system are made based upon this current understanding of spin transfer and spin polarization. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the present invention is described in the context of magnetic elements having particular layers. However, one of ordinary skill in the art will readily recognize that magnetic elements having additional and/or different layers not inconsistent with the present invention could also be used. Moreover, certain components are described as being ferromagnetic. However, as used herein, the term ferromagnetic could include ferrimagnetic or like structures. Thus, as used herein, the term "ferromagnetic" includes, but is not limited to ferromagnets and ferrimagnets. The present invention is also described in the context of single elements. However, one of ordinary skill in the art will readily recognize that the present invention is consistent with the use of magnetic memories having multiple elements, bit lines, and word lines.

Figure 3:
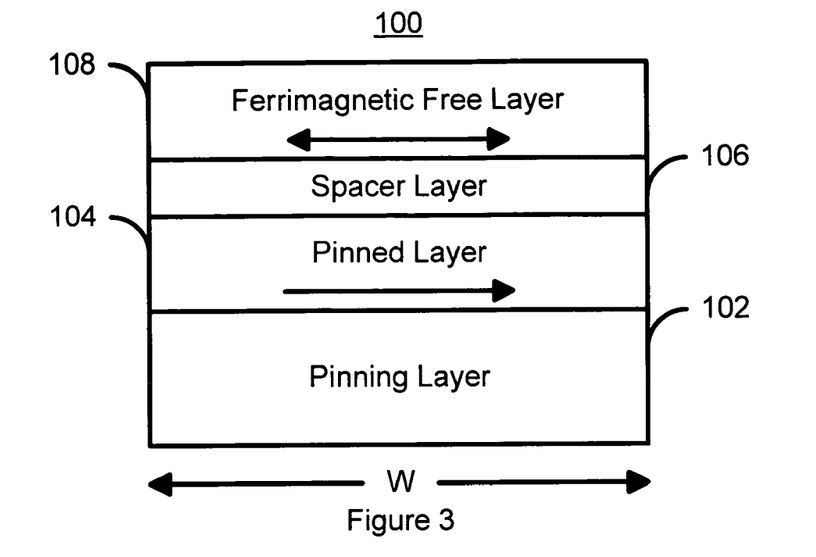
FIG. 3 is a diagram of a first embodiment of a magnetic element in accordance with the present invention and which can be written using spin transfer.

FIG. 3 is a diagram of a first embodiment of a magnetic element 100 in accordance with the present invention and which can be written using spin transfer. The magnetic element 100 includes a pinning layer 102 that is preferably an AFM layer, pinned layer 104, a spacer layer 106, and a free layer 108 that is ferrimagnetic. In an alternate embodiment, the pinning layer 102 may be omitted in favor of another mechanism for pinning the magnetizations of the pinned layer 104. In a preferred embodiment, the AFM layer 102 includes materials such as PtMn and IrMn which have a high blocking temperature, above two hundred degrees Celsius. In addition, one or more seed layers (not shown) may be used to provide a desired texture of the AFM layer 102. The pinned layer 104 may be a simple layer, for example composed of a ferromagnetic alloy including Co, Fe, or Ni. Additives such as B and/or Ta may optionally be added to modify the structure of the pinned layer 104. The pinned layer 104 may also be a synthetic pinned layer, for example including two ferromagnetic layers separated by a nonmagnetic, conductive spacer layer such as Ru. In one embodiment, nonmagnetic conductive spacer layer may be configured such that the magnetizations of the ferromagnetic layers are antiferromagnetically aligned.

The spacer layer 106 is preferably an insulating barrier layer through which current carriers may tunnel. In one embodiment, the spacer layer 106 is a crystalline MgO layer. In such an embodiment, the spacer layer 106 is preferably less than three nanometers thick. Also in such an embodiment, the spacer layer 106 is configured such that the resistance-area product of the magnetic element 100 is low, less than one thousand Ohm-micrometers squared. In another embodiment, the spacer layer 106 may be another insulator, such as alumina. In alternate embodiments, the spacer layer 106 might be a conductive layer or a nano-oxide layer.

The free layer 108 is ferrimagnetic and thus preferably has a reduced moment. The free layer 108 may be a simple layer, or may be a bilayer, described below. If the free layer is a simple layer, then in some embodiments, the free layer may include a conductive ferrite, a garnet, a ferrimagnetic alloy excluding a rare earth, a heavy rare-earth-transition metal alloy or a half-metallic ferrimagnet. If the free layer 108 includes a conductive ferrite, then the conductive ferrite is preferably $Fe_3O_4$. If the free layer 108 is a garnet, then Yittrium Iron Garnet (YIG) is preferably used. If the ferrimagnetic alloy is used, then the free layer preferably includes at least one of $Mn_2Sb$, $Mn_2Sn$, $Mn_3Ga$, $Mn_3Ge_2$, $Mn_3In$, $FeGe_2$, $FeSe$, $Cr_3As_2$, and $CrPt_3$. If the free layer 108 includes the heavy rare-earth-transition metal alloy, then the free layer 108 preferably includes $RCo_5$ where R include Gd, Tb, Dy, Ho, Eb, or Tm. If the free layer 108 is a half-metallic ferrimagnet, then the free layer preferably includes $Co_2(Cr_{1-x}Fe_x)Al$, $Co_2MnAl$, or $Co_2MnSi$.

In another embodiment, the free layer 108 is a bilayer. If the bilayer is used for the free layer 108, then one layer is preferably a rare earth-transition metal alloy, while another layer is preferably a spin current enhancement layer. The spin current enhancement layer would reside between the rare earth-transition metal alloy layer and the spacer layer 106. The rare earth-transition metal alloy may include materials such as $CoRE_x$, where RE includes Gd, Tb, Dy, Ho, Em, or Tm and x is at least six and not more than thirty percent. The rare earth-transition metal alloy may also include material such as $(CoRE_j)Z_k$, where RE includes Gd, Tb, Dy, Ho, Em, or Tm, Z includes Au, Cu, B, Cr, or Mo, k is at least five and not more than forty percent, and j is at least ten and not more than thirty percent. The rare earth-transition metal alloy is configured so that the rare earth and transition metal moments are antiparallel. In addition, the rare earth-transition metal alloy is preferably configured to be near the compensation point. As a result, the free layer 108' has a reduced moment. In one embodiment, the free layer 108, the combination of the rare earth-transition metal and spin current enhancement layers, may have a moment of less than six hundred emu per cubic centimeter. In a preferred embodiment, the free layer 108 has a moment of less than four hundred emu per cubic centimeter.

The spin current enhancement layer provides an interfacial layer between the rare earth-transition metal alloy layer and the spacer layer 106. The spin current enhancement layer is configured to provide a higher magnetoresistance (e.g. a tunneling magnetoresistance of greater than fifty percent in one embodiment) for the magnetic element 100. In a preferred embodiment, the spin current enhancement layer is an alloy including Co, Ni, or Fe and may include additives of nonmagnetic elements such as B, Ta, or Zr. In addition, the magnetization of the rare earth-transition metal alloy and the magnetization of the spin current enhancement layer preferably have a fixed relationship, such as oriented parallel or antiparallel. Consequently, a change in the direction of magnetization for one layer of the free layer 108 results in a change in the direction of magnetization for the other layer of the free layer 108, respectively.

The magnetic element 100 is also configured to allow the free layer 108 to be switched due to spin transfer when a write current is passed through the magnetic element 100. In a preferred embodiment, the lateral dimensions, such as the width w, of the free layer 108 are thus small and preferably less than two hundred nanometers. In addition, some difference is preferably provided between the lateral dimensions to ensure that the free layer 108 has a particular easy axis.

In operation, a read current may be driven through the magnetic element 100, particularly in the CPP configuration, and the magnetoresistance determined. To write to the magnetic element 100, a write current which is preferably greater than the read current may be driven in the CPP direction through the magnetic element 100. To align the direction of magnetization of the free layer 108 current is driven from the top of the magnetic element 100 to the bottom. Consequently, electrons flow in the opposite direction. The majority of electrons have their spins aligned in the direction of magnetization of the pinned layer 104. A sufficient density of electrons can exert a spin torque on the free layer 108, and cause the magnetization of the free layer 108 to switch to be parallel to the magnetization of the pinned layer 104. Note that if the magnetization of the free layer 108 is already parallel, then no switching occurs. To align the magnetization of the free layer 108 antiparallel to the magnetization of the pinned layer 104, the current is driven in the opposite direction, from the bottom of the magnetic element 100 to the top. Electrons travel from the top of the magnetic element to the bottom. Electrons having their spins aligned antiparallel to the pinned layer 104 are reflected back to the free layer 108. At a sufficient current density, these reflected electrons can switch the magnetization of the free layer 108 to be antiparallel to the magnetization of the pinned layer 104.

Thus, the magnetic element 100 is configured to be written using the spin transfer effect, a local phenomenon. The magnetic element 100 may thus be suitable for higher density application. In addition, the magnetic element 100 may be written at a lower current density. Because the free layer 108 is ferrimagnetic, the free layer 108 has a reduced saturation magnetization, $M_S$. For example, in the embodiment in which the free layer 108 includes the rare earth-transition metal alloy layer and the spin current enhancement layer, the free layer 108 may be configured to have a saturation magnetization of not more than four hundred emu/cc by selecting the rare earth-transition metal alloy of the layer to be near the compensation point. The switching current density is proportional to the square of the saturation magnetization. In particular, the critical current density for switching a free layer having an anisotropy field $H_k$ is $$j_{co} = \frac{4\pi\alpha M_s t_F e}{\eta h}[H_k + 2\pi M_s]$$

Because the free layer 108 has a reduced saturation magnetization, the free layer 108 may be switched at a lower current density. Moreover, this lower current density may be used without sacrificing thermal stability. At the exact compensation point of a rare earth-transition metal alloy, the coercivity approaches infinity. As discussed above, the rare earth-transition metal alloy layer is preferably configured to be near the compensation point. In addition to having a low saturation magnetization, the coercivity may be high (for example 50 Oe to 400 Oe). As a result, the intrinsic anisotropy may be high. This feature results in reduced switching due to thermal fluctuations and improved thermal stability of the magnetic element 100. Consequently, the magnetic element 100 may be switched via the spin transfer effect at a lower current density without unduly sacrificing thermal stability.

Figure 4:
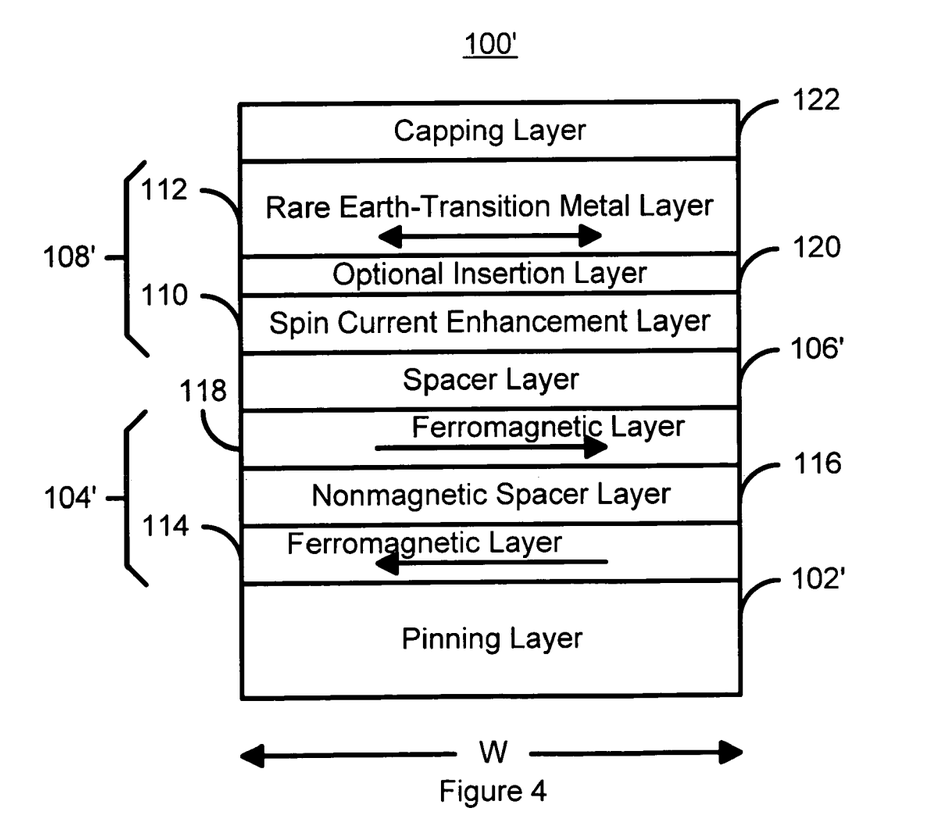
FIG. 4 is a diagram of a second version of the first embodiment of a magnetic element in accordance with the present invention and which can be written using spin transfer.

FIG. 4 is a diagram of a second, preferred, version of the first embodiment of a magnetic element 100' in accordance with the present invention and which can be written using spin transfer. Portions of the magnetic element 100' are analogous to the magnetic element 100 and are, therefore, labeled similarly. Consequently, the magnetic element 100' includes pinning layer 102', pinned layer 104', spacer layer 106', and free layer 108'. The free layer 108' preferably includes spin current enhancement layer 110 and rare earth transition metal alloy layer 112. However, in an alternate embodiment, the free layer 108' may be a single constituent layer, as described above for the free layer 108. The free layer 108' may also optionally include an optional insertion layer 120 that is preferably composed of materials such as Ru, Rh, Ta, and Cr and preferably has a thickness of not more than one nanometer. The optional insertion layer 120 is configured to reduce or eliminate interdiffusion between the spin current enhancement layer 110 and the rare earth-transition metal alloy layer 112. The pinned layer 104' may include ferromagnetic layers 114 and 118 separated by nonmagnetic spacer layer 116. The magnetic element 100' may also include a capping layer 122.

The pinning layer 102' is preferably an AFM such as PtMn or IrMn. In an alternate embodiment, the pinning layer 102' may be omitted in favor of another mechanism for pinning the magnetizations of the pinned layer 104'. In addition, one or more seed layers (not shown) may be used to provide a desired texture of the pinning layer 102'.

The pinned 104' preferably includes ferromagnetic layers 114 and 118. The ferromagnetic layer 114 and 118 may each be a simple layer, for example composed of a ferromagnetic alloy including Co, Fe, or Ni. Additives such as B and/or Ta may optionally be added to modify the structure of the ferromagnetic layers 114 and 118. The nonmagnetic spacer layer 116 is preferably conductive and includes materials such as Ru. In a preferred embodiment, the ferromagnetic layers 114 and 118 have their magnetizations antiferromagnetically aligned. In an alternate embodiment, the pinned layer 104' may have another structure, such as a simple layer.

The spacer layer 106' is preferably an insulating barrier layer through which current carriers may tunnel. In one embodiment, the spacer layer 106' is a crystalline MgO layer less than three nanometers thick. In another embodiment, the spacer layer 106' may be another insulator, such as alumina. In either embodiment, the spacer layer 106' is preferably configured such that the resistance-area product of the magnetic element 100' is low, for example less than approximately one thousand Ohms-micrometer squared. In alternate embodiments, the spacer layer 106' may be a conductor or a nano-oxide layer.

The free layer 108' is ferrimagnetic and thus may have a reduced moment. The free layer 108' may be a single layer, or may be a bilayer including layers 110 and 112, as shown. If the free layer 108' is a single layer, then in some embodiments, the free layer 108' may the materials discussed above with respect to the free layer 108.

In a preferred embodiment, the free layer 108' is a bilayer including the layers 110 and 112. In such an embodiment, the layer 112 is preferably a rare earth-transition metal alloy, while the layer 110 is preferably a spin current enhancement layer. The optional insertion layer 120 may also be included in the free layer 108', between the layers 110 and 112. The rare earth-transition metal alloy layer 112 may include materials such as $CoRE_x$, where RE includes Gd, Tb, Dy, Ho, Em, or Tm and x is at least six and not more than thirty percent. In another embodiment, the rare earth-transition metal alloy layer 112 may include $(CoRE_j)Z_k$, where RE includes Gd, Tb, Dy, Ho, Em, or Tm, Z includes Au, Cu, B, Cr, or Mo, k is at least five and not more than forty percent, and j is at least ten and not more than thirty percent. The rare earth-transition metal alloy is configured so that the rare earth and transition metal moments are antiparallel. As a result, the free layer 108' has a reduced moment. In another embodiment in which f the free layer 108' is a half-metallic ferrimagnet, then the free layer preferably includes $Co_2(Cr_{1-x}Fe_x)Al$, $Co_2MnAl$, or $Co_2MnSi$. In one embodiment, the free layer 108' may have a moment of less than six hundred emu per cubic centimeter.

The spin current enhancement layer 110 is configured to provide a higher magnetoresistance (e.g. a tunneling magnetoresistance of greater than fifty percent in one embodiment) for the magnetic element 100'. In a preferred embodiment, the spin current enhancement layer 110 is an alloy including Co, Ni, or Fe and may include additives of nonmagnetic elements such as B, Ta, or Zr. In addition, the magnetization of the rare earth-transition metal alloy layer 112 and the magnetization of the spin current enhancement layer 110 preferably have a fixed relationship, such as oriented parallel or antiparallel. Consequently, a change in the direction of magnetization for one layer 110 or 112 results in a change the direction of magnetization for the other layer 112 or 110, respectively.

The capping layer 122 preferably includes materials such as Ta, Ru, or other refractory metals or alloys. The capping layer 122 is preferably configured to prevent inter-diffusion from other materials (not shown) and to provide protection to the free layer 108' during processing. In addition, the capping layer 122 may be used to modify the anisotropy of the free layer 108'. For example, the capping layer 122 may be configured to reduce the out-of-plane anisotropy of the free layer 108'.

The magnetic element 100' is also configured to allow the free layer 108' to be switched due to spin transfer when a write current is passed through the magnetic element 100'. In a preferred embodiment, the lateral dimensions, such as the width w, of the free layer 108' are thus small and preferably less than two hundred nanometers. In addition, some difference is preferably provided between the lateral dimensions to ensure that the free layer 108' has a particular easy axis.

In operation, the magnetic element 100' functions in a manner analogous to the magnetic element 100. Thus, to read the magnetic element 100', a read current may be driven through the magnetic element 100'. To write to the magnetic element 100', a write current which is greater than the read current may be driven in the CPP direction through the magnetic element 100'. To align the direction of magnetization of the free layer 108' (the magnetization of the rare earth transition metal alloy layer 112 if the free layer 108' is a bilayer), current is driven from the top of the magnetic element 100' to the bottom. To align the magnetization of the free layer 108' antiparallel to the magnetization of the ferromagnetic layer 118 of the pinned layer 104', the current is driven in the opposite direction.

The magnetic element 100' shares many of the benefits of the magnetic element 100. In particular, the magnetic element 100' may be written using the spin transfer effect, a localized phenomenon. Moreover, this writing may occur at a lower current density due to the reduced saturation magnetization of the free layer 108'. As discussed above, this may be achieved without unduly sacrificing thermal stability.

Figure 5:
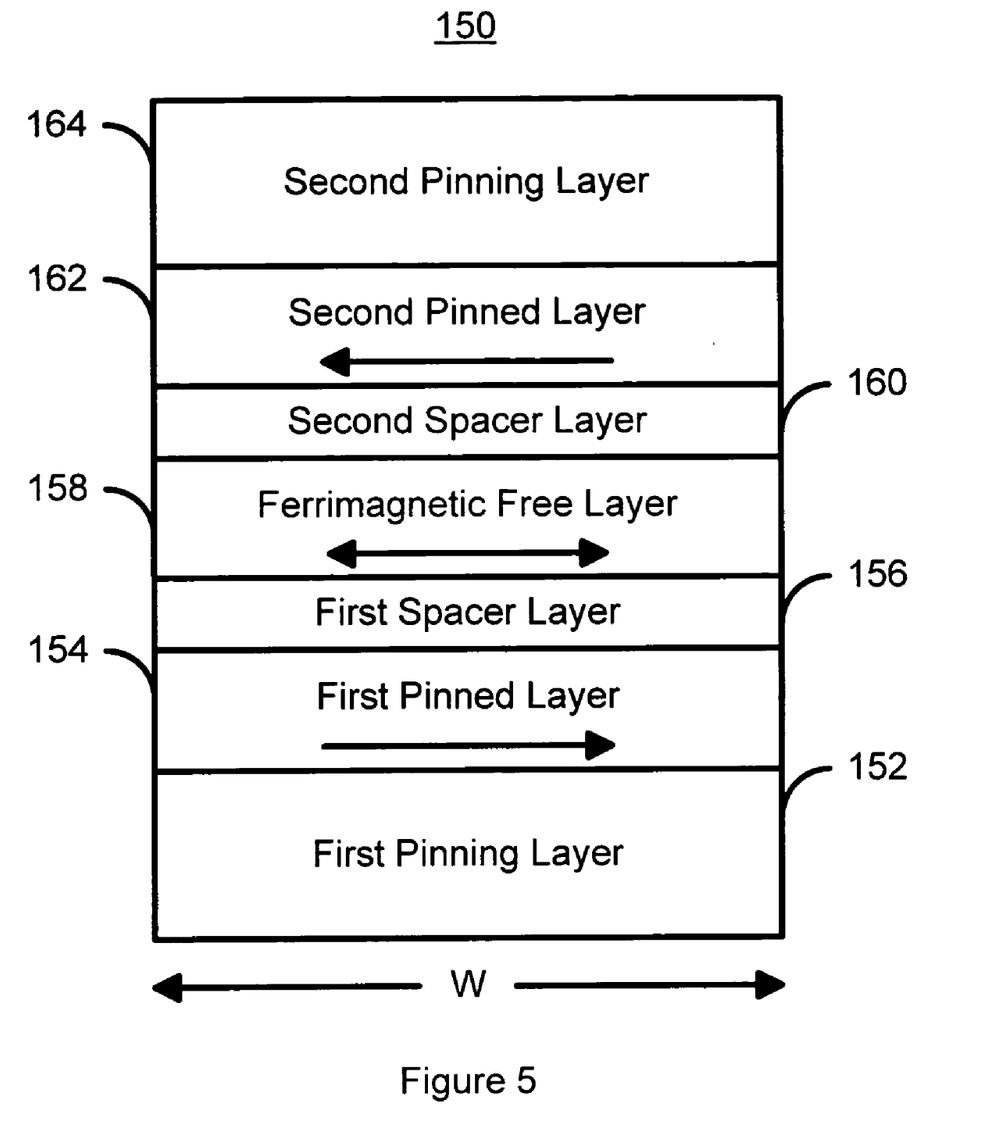
FIG. 5 is a diagram of a second embodiment of a magnetic element in accordance with the present invention and which can be written using spin transfer.

FIG. 5 is a diagram of a second embodiment of a magnetic element 150 in accordance with the present invention and which can be written using spin transfer. Portions of the magnetic element 150 are analogous to the magnetic element 100. However, the magnetic element 150 is a dual structure including two pinned and two spacer layers. The magnetic element 150 includes a first pinning layer 152 that is preferably an AFM layer, a first pinned layer 154, a first spacer layer 156, a free layer 158 that is ferrimagnetic, a second spacer layer 160, a second pinned layer 162, and a second pinning layer 164. In an alternate embodiment, one or more of the pinning layers 152 and 164 may be omitted in favor of another mechanism for pinning the magnetizations of the pinned layers 154 and 162. In a preferred embodiment, the AFM layers 152 and 164 include materials such as PtMn and IrMn which have a high blocking temperature. In addition, one or more seed layers (not shown) may be used to provide a desired texture of the AFM layer 152. The pinned layers 154 and 162 might be a simple layer, for example composed of a ferromagnetic alloy including Co, Fe, or Ni. Additives such as B and/or Ta may optionally be added to modify the structure of the pinned layers 154 and 162, respectively. However, the pinned layer 154 and/or the pinned layer 162 may be a synthetic pinned layer. In a preferred embodiment, the pinned layer 154 may include two ferromagnetic layers separated by a nonmagnetic, conductive spacer layer such as Ru. In one embodiment, nonmagnetic conductive spacer layer may be configured such that the magnetizations of the ferromagnetic layers are antiferromagnetically coupled. In such an embodiment, the pinned layer 162 may include three ferromagnetic layers each separated by a nonmagnetic, conductive spacer layers such as Ru. In one embodiment, nonmagnetic conductive spacer layers may be configured such that the magnetizations of the ferromagnetic layers are antiferromagnetically coupled.

The spacer layers 156 and 160 are preferably insulating barrier layers through which current carriers may tunnel. In one embodiment, the spacer layer 156 is a crystalline MgO layer. In such an embodiment, the spacer layer 156 is preferably less than three nanometers thick. In an alternate embodiment, the spacer layer 156 might be another insulator, such as alumina. Also in a preferred embodiment, the second spacer layer 160 is either crystalline MgO or alumina. Spacer layers 156 and 160 are thin enough to allow for electron tunneling. Thus, in a preferred embodiment, the resistance area product of the magnetic element 150 is less than one thousand Ohms-micrometer squared. In alternate embodiments, the spacer layers 156 and/or 160 may be a conductive or nano-oxide layer.

The free layer 158 is ferrimagnetic and thus may have a reduced moment. The free layer 158 may be a single layer, or may be a multilayer. If the free layer 158 is a single layer, then in some embodiments, the free layer may include a conductive ferrite, a garnet, a ferrimagnetic alloy excluding a rare earth, a heavy rare-earth-transition metal alloy or a half-metallic ferromagnet. If the free layer 158 includes a conductive ferrite, then the conductive ferrite may be $Fe_3O_4$. If the free layer 158 is a garnet, then Yittrium Iron Garnet (YIG) may be used. If the ferrimagnetic alloy is used, then the free layer may include at least one of $Mn_2Sb$, $Mn_2Sn$, $Mn_3Ga$, $Mn_3Ge_2$, $Mn_3In$, $FeGe_2$, $FeSe$, $Cr_3As_2$, and $CrPt_3$. The heavy rare-earth-transition metal alloy of the free layer 158 may include $RCo_5$ where R include Gd, Tb, Dy, Ho, Eb, or Tm. If the free layer 158 is a half-metallic ferrimagnet, then the free layer preferably includes $Co_2(Cr_{1-x}Fe_x)Al$, $Co_2MnAl$, or $Co_2MnSi$.

In another embodiment, the free layer 158 is a multilayer. If the multilayer is used for the free layer 158, then the layers are preferably a rare earth-transition metal alloy and spin current enhancement layers between the rare earth-transition metal layer and the spacer layers 156 and 160. The rare earth-transition metal alloy may include materials such as $CoRE_x$, where RE includes Gd, Tb, Dy, Ho, Em, or Tm and x is at least six and not more than thirty percent. The rare earth-transition metal alloy might also include $(CoRE_j)Z_k$, where RE includes Gd, Tb, Dy, Ho, Em, or Tm, Z includes Au, Cu, B, Cr, or Mo, k is at least five and not more than forty percent, and j is at least ten and not more than thirty percent. The rare earth-transition metal alloy is configured so that the rare earth and transition metal moments are antiparallel. As a result, the free layer 158 has a reduced moment. In one embodiment, the free layer 158 may have a moment of, for example, less than six hundred emu per cubic centimeter.

Spin current enhancement layers provide an interfacial layer between the rare earth-transition metal alloy layer and the spacer layers 156 and 160 and are configured to provide a higher magnetoresistance for the magnetic element 150. In a preferred embodiment, the spin current enhancement layers are alloys including Co, Ni, or Fe and may include additives of nonmagnetic elements such as B, Ta, or Zr. The spin current enhancement layers exclude Tb and, preferably, exclude rare earths. In addition, the magnetization of the rare earth-transition metal alloy and the magnetizations of the spin current enhancement layer preferably have a fixed relationship, such as oriented parallel or antiparallel. Consequently, a change in the direction of magnetization for one layer results in a change in the direction of magnetization for the other layer, respectively.

The magnetic element 150 is also configured to allow the free layer 158 to be switched due to spin transfer when a write current is passed through the magnetic element 150. In a preferred embodiment, the lateral dimensions, such as the width w, of the free layer 158 are thus small and preferably less than two hundred nanometers. In addition, some difference is preferably provided between the lateral dimensions to ensure that the free layer 158 has a particular easy axis.

The magnetic element 150 operates in an analogous manner to the magnetic elements 100 and 100'. However, because the magnetic element 150 is a dual structure, the magnetic element 150 may have a higher magnetoresistance. In addition, for pinned layers 154 and 162 oriented as depicted, the spin transfer effect may be enhanced due to electrons reflected from the layer 162 or the layer 154. Consequently, the magnetic element 150 may be written using the spin transfer effect at an even lower current density, while having greater magnetoresistance. Moreover, this may be achieved while maintaining thermal stability.

Figure 6:
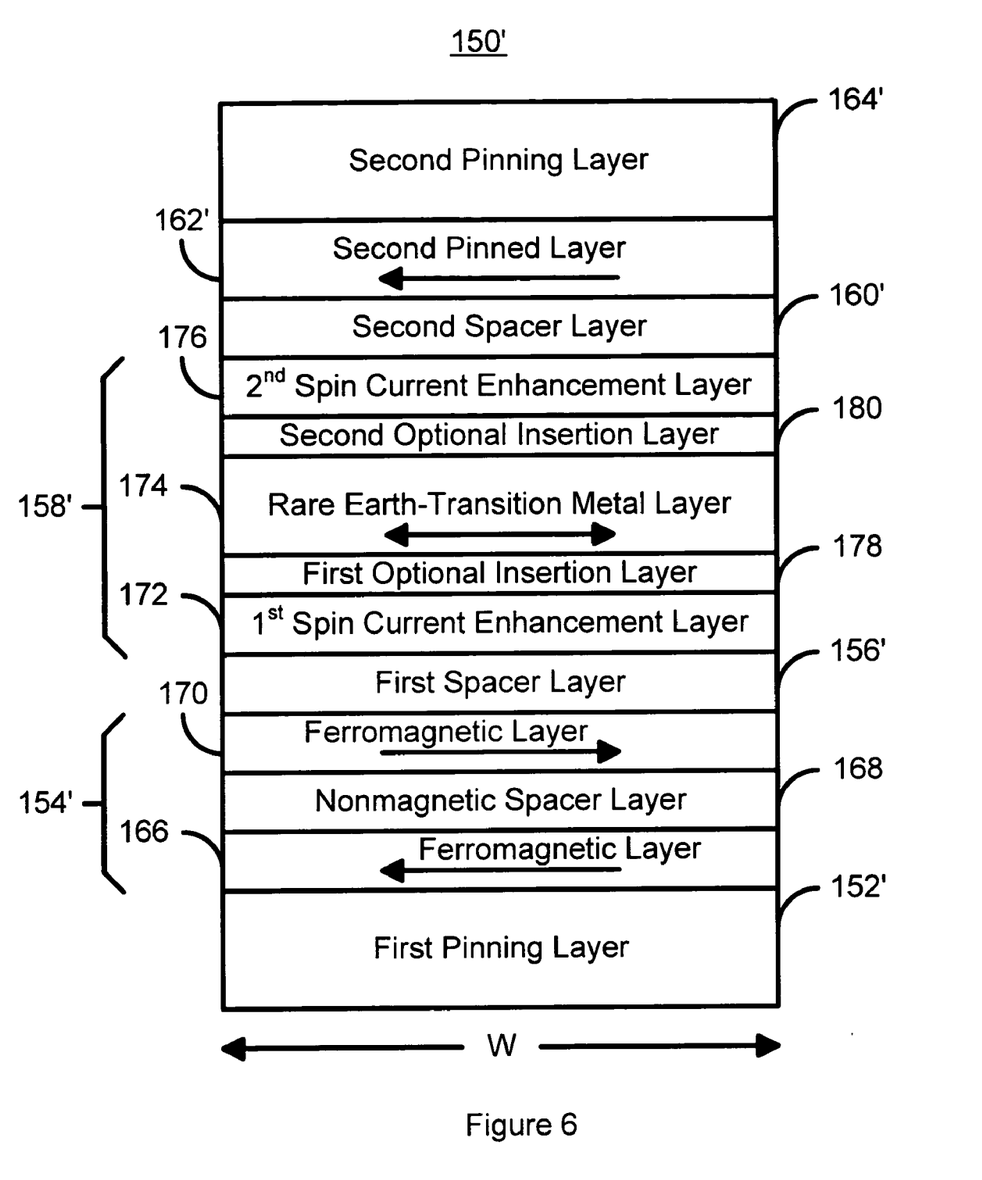
FIG. 6 is a diagram of another version of the second embodiment of a magnetic element in accordance with the present invention and which can be written using spin transfer.

FIG. 6 is a diagram of another version of the second embodiment of a magnetic element 150' in accordance with the present invention and which can be written using spin transfer. Portions of the magnetic element 150' are analogous to the magnetic element 150 and are, therefore, labeled similarly. Consequently, the magnetic element 150' includes a first pinning layer 152' that is preferably an AFM layer, a first pinned layer 154', a first spacer layer 156', a free layer 158', an additional spacer layer 160', a second pinned layer 162', and a second pinning layer 164'. The pinned layers 154' and 162' might be simple layers, as described above. However, in a preferred embodiment, the pinned layer 154' is a synthetic pinned layer including ferromagnetic layers 166 and 170 separated by a nonmagnetic layer 168 that is a conductor, such as Ru. The ferromagnetic layers 166 and 170 may be alloys including Co, Fe, and/or Ni and may include additives of nonmagnetic elements such as B, Ta, or Zr. In one embodiment, nonmagnetic conductive spacer layer may be configured such that the magnetizations of the ferromagnetic layers are antiferromagnetically coupled. Although depicted as a simple layer, the pinned layer 162' may be a synthetic pinned layer for example including three ferromagnetic layers each separated by a nonmagnetic, conductive spacer layers such as Ru. In one embodiment, nonmagnetic conductive spacer layers may be configured such that the magnetizations of the ferromagnetic layers are antiferromagnetically coupled.

The spacer layers 156' and 160' are preferably insulating barrier layers through which current carriers may tunnel, as described above. However, other structure such as a conductive layer and/or a nano-oxide layer may be possible for either the spacer layer 156', the spacer layer 160', or both. In a preferred embodiment, the AFM layers 152' and 164' include materials such as PtMn and IrMn which have a high blocking temperature. In addition, one or more seed layers (not shown) may be used to provide a desired texture of the AFM layer 152'. In an alternate embodiment, one or more of the pinning layers 152' and 164' may be omitted in favor of another mechanism for pinning the magnetizations of the pinned layers 154' and 162'.

The free layer 158' is ferrimagnetic and thus may have a reduced moment. The free layer 158' may be a single layer, or may be a multilayer as depicted in FIG. 6. If the free layer 158' is a single layer, then in some embodiments, the free layer may include a conductive ferrite, a garnet, a ferrimagnetic alloy excluding a rare earth, or a heavy rare-earth-transition metal alloy, as described above.

In another embodiment, the free layer 158' is a multilayer as depicted in FIG. 6. The free layer 158' includes a rare earth-transition metal alloy layer 174 and spin current enhancement layers 172 and 176 between the rare earth-transition metal layer 174 and the spacer layers 156' and 160'. In addition, optional insertion layers 178 and 180, which may include not more than one nanometer of materials such as Ru, Rh, Ta, and Cr, are included to reduce interdiffusion. The rare earth-transition metal alloy layer 174 may include materials such as $CoRE_x$, where RE includes Gd, Th, Dy, Ho, Em, or Tm and x is at least six and not more than thirty percent or $(CoRE_j)Z_k$, where RE includes Gd, Th, Dy, Ho, Em, or Tm, Z includes Au, Cu, B, Cr, or Mo, k is at least five and not more than forty percent, and j is at least ten and not more than thirty percent. The rare earth-transition metal alloy layer 174 is also configured so that the rare earth and transition metal moments are antiparallel. As a result, the free layer 158' has a reduced moment. In one embodiment, the free layer 158' may have a moment of less than six hundred emu per cubic centimeter or, in a preferred embodiment, four hundred emu per cubic centimeter.

The spin current enhancement layers 172 and 176 provide an interfacial layer between the rare earth-transition metal alloy layer 174 and the spacer layers 156' and 160'. The spin current enhancement layers 172 and 176 are thus configured to provide a higher magnetoresistance for the magnetic element 150'. The spin current enhancement layers 172 and 176 exclude Tb and preferably exclude all rare earths. In a preferred embodiment, the spin current enhancement layers 172 and 176 are alloys including Co, Ni, or Fe and may include additives of nonmagnetic elements such as B, Ta, or Zr. In addition, the magnetization of the rare earth-transition metal alloy layer 174 and the magnetizations of the spin current enhancement layers 172 and 176 preferably have a fixed relationship, such as oriented parallel or antiparallel. Consequently, a change in the direction of magnetization for one layer results in a change in the direction of magnetization for the other layer, respectively.

The magnetic element 150' is also configured to allow the free layer 158' to be switched due to spin transfer when a write current is passed through the magnetic element 150'. In a preferred embodiment, the lateral dimensions, such as the width w, of the free layer 158' are thus small and preferably less than two hundred nanometers. In addition, some difference is preferably provided between the lateral dimensions to ensure that the free layer 158' has a particular easy axis.

The magnetic element 150' operates in an analogous manner to the magnetic elements 100, 100', and 150. However, because the magnetic element 150' is a dual structure, the magnetic element 150' may have a higher magnetoresistance. In addition, for pinned layers 154' and 162' as depicted, the spin transfer effect may be enhanced due to electrons reflected from the layer 162' or the layer 170. Consequently, the magnetic element 150' may be written using the spin transfer effect at an even lower current density, while having greater magnetoresistance. Moreover, this may be achieved while maintaining thermal stability. Thus, using the magnetic elements 100, 100', 150, and 150', the spin transfer effect can be used to write at a lower current density.

Figure 7:
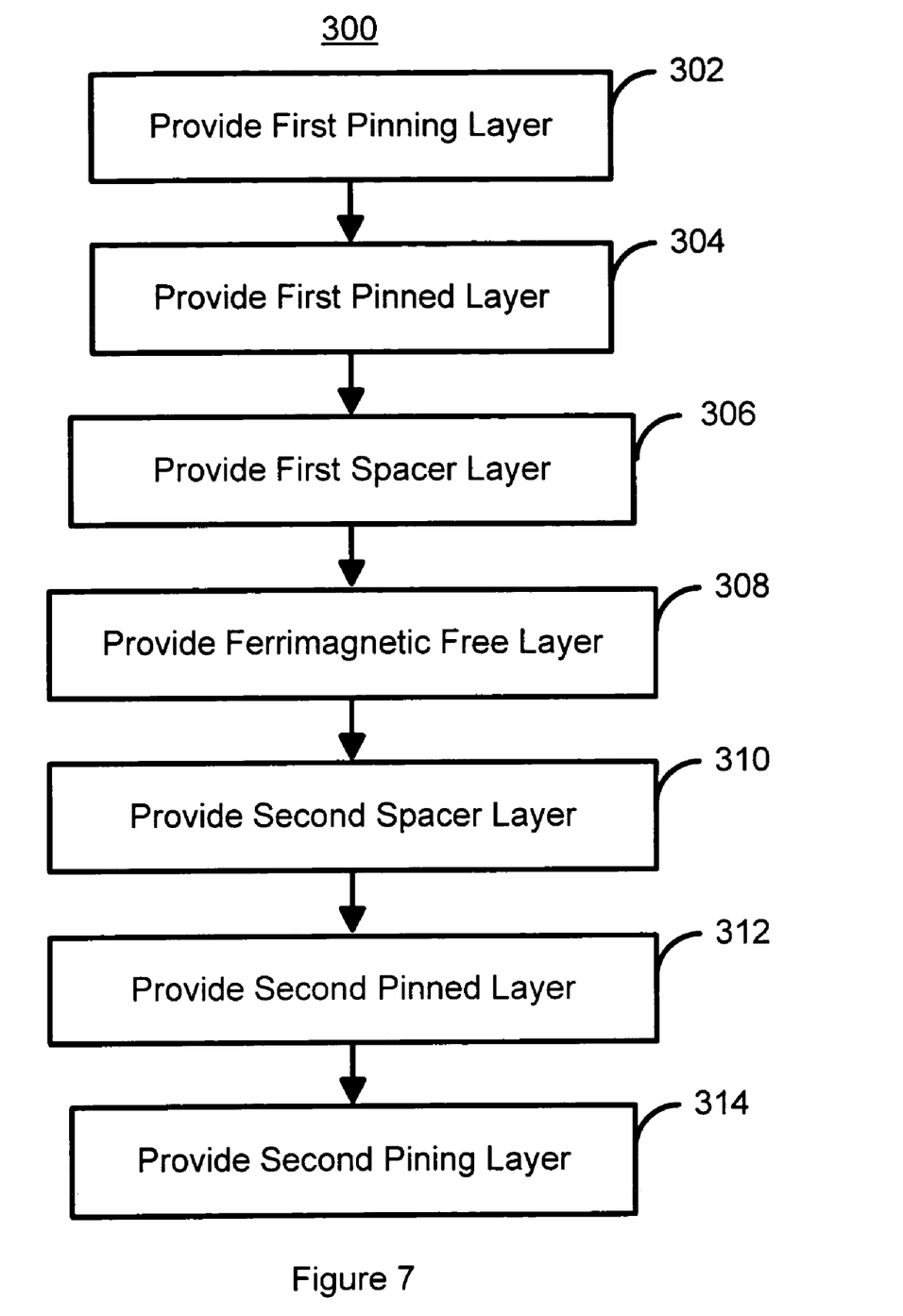
FIG. 7 is a diagram depicting one embodiment of a method in accordance with the present invention for providing magnetic element in accordance which can be written using spin transfer.

FIG. 7 is a diagram depicting one embodiment of a method 300 in accordance with the present invention for providing magnetic element in accordance which can be written using spin transfer. The method 300 is described in connection with the magnetic elements 100 and 150. However, the method 300 could be used with other magnetic elements in accordance with the present invention.

A pinning layer 102/152 may be provided, via step 302. Step 302 thus preferably includes providing a desired AFM layer. A pinned layer 104/154 is provided, via step 304. A spacer layer is provided, via step 306. Step 306 preferably includes providing an insulating barrier layer. The free layer 108/158 is provided, via step 308. Step 308 thus includes providing a ferrimagnetic free layer 108/158. In one embodiment, step 308 includes providing a single layer, described above, or a multilayer including at least one spin current enhancement layer and a rare earth-transition metal layer. For the magnetic element 100 or 100', the method 300 may then terminate or provide a capping layer. However, for the magnetic element 150 or 150', the second spacer layer 160/160' is provided, via step 310. Step 310 preferably includes forming an insulating barrier layer. The second pinned layer 162/162' may be fabricated, via step 312. Step 312 may include providing a simple pinned layer 162/162' or a synthetic pinned layer. A second pinning layer 164/164' may be provided, via step 314.

Thus, the method 300 can be used to form the magnetic elements 100, 100', 150, and/or 150'. Consequently, the benefits of the magnetic elements 100, 100', 150 and/or 150' may be achieved.

A method and system for providing a magnetic element capable of being written using spin transfer has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A magnetic element comprising:
a pinned layer;
a spacer layer;
a free layer, the free layer being ferrimagnetic and including at least one of a conductive ferrite, a garnet, a ferrimagnetic alloy excluding a rare earth, a heavy rare-earth transition metal alloy, a half-metallic ferrimagnet, and a bilayer including a rare earth transition metal alloy layer and a spin current enhancement layer residing between the rare-earth transition metal alloy layer and the spacer layer;
wherein the magnetic element is configured to allow the free layer to be switched using spin transfer when a write current is passed through the magnetic element;
wherein the pinned layer is a synthetic pinned layer including a first ferromagnetic layer, a second ferromagnetic layer, and a nonmagnetic conductive layer residing between the first ferromagnetic layer and the second ferromagnetic layer.

2. The magnetic element of claim 1 wherein the first ferromagnetic layer and the second ferromagnetic layer include at least one of Co, Ni, and Fe.

3. The magnetic element of claim 2 wherein the first ferromagnetic layer and the second ferromagnetic layer include at least one of B, Ta and Zr.

4. The magnetic element of claim 1 wherein the free layer includes the rare-earth transition metal alloy layer including $CoRE_x$, where RE includes at least one of Gd, Tb, Dy, Ho, Em, and Tm, and x is at least six and not more than thirty percent.

5. The magnetic element of claim 1 wherein the free layer includes the rare-earth transition metal alloy layer including $(CoRE_x)Z_y$, where RE includes at least one of Gd, Tb, Dy, Ho, Em, and Tm, Z includes at least one of Au, Cu, B, Cr, and Mo, y is at least five and not more than forty percent, and x is at least ten and not more than thirty percent.

6. The magnetic element of claim 1 wherein the free layer includes the conductive ferrite, and wherein the conductive ferrite includes $Fe_3O_4$.

7. The magnetic element of claim 1 wherein the free layer includes the garnet and the garnet includes Yttrium Iron Garnet.

8. The magnetic element of claim 1 wherein the free layer includes the ferrimagnetic alloy, the ferrimagnetic alloy including at least of $Mn_2Sb$, $Mn_2Sn$, $Mn_3Ga$, $Mn_3Ge_2$, $Mn_3In$, $FeGe_2$, $FeSe$, $Cr_3As_2$, and $CrPt_3$.

9. The magnetic element of claim 1 wherein the free layer includes the heavy rare-earth-transition metal alloy, the heavy rare-earth-transition metal alloy including $RCo_5$ where R includes at least one of Gd, Tb, Dy, Ho, Eb, and Tm.

10. The magnetic element of claim 1 wherein the free layer includes the half-metallic ferrimagnet and wherein the half metallic ferrimagnet includes at least one of $Co_2(Cr_{1-x}Fe_x)Al$, $Co_2MnAl$, and $Co_2MnSi$.

11. The magnetic element of claim 1 wherein the spin current enhancement layer includes at least one of Co, Ni and Fe.

12. The magnetic element of claim 11 wherein the spin current enhancement layer includes at least one of B, Ta, and Zr.

13. The magnetic element of claim 1 wherein the free layer includes the bilayer including the rare earth transition metal alloy layer and the spin current enhancement layer residing between the rare-earth transition metal alloy layer and the spacer layer.

14. The magnetic element of claim 1 wherein the rare-earth transition metal alloy layer includes at least one of $CoRE_w$ and $(CoRE_x)Z_y$, where RE includes at least one of Gd, Tb, Dy, Ho, Em, and Tm, Z includes at least one of Au, Cu, B, Cr, and Mo, w is at least six and not more than thirty percent, x is at least ten and not more than thirty percent, and y is at least five and not more than forty percent, and wherein the half metallic ferrimagnet includes at least one of $Co_2(Cr_{1-x}Fe_x)Al$, $Co_2MnAl$, and $Co_2MnSi$.

15. A magnetic element comprising:
a pinned layer;
a spacer layer;
a free layer, the free layer being ferrimagnetic and including at least one of a conductive ferrite, a garnet, a ferrimagnetic alloy excluding a rare earth, a heavy rare-earth transition metal alloy, a half-metallic ferrimagnet, and a bilayer including a rare earth transition metal alloy layer and a spin current enhancement layer residing between the rare-earth transition metal alloy layer and the spacer layer;
wherein the magnetic element is configured to allow the free layer to be switched using spin transfer when a write current is passed through the magnetic element;

wherein the spacer layer is an insulating barrier layer and wherein the insulating barrier layer includes crystalline MgO.

16. The magnetic element of claim 15 wherein the insulating barrier layer has a thickness of less than three nanometers.

17. A magnetic element comprising:
a pinned layer;
a spacer layer;
a free layer, the free layer being ferrimagnetic and including at least one of a conductive ferrite, a garnet, a ferrimagnetic alloy excluding a rare earth, a heavy rare-earth transition metal alloy, a half-metallic ferrimagnet, and a bilayer including a rare earth transition metal alloy layer and a spin current enhancement layer residing between the rare-earth transition metal alloy layer and the spacer layer;
wherein the magnetic element is configured to allow the free layer to be switched using spin transfer when a write current is passed through the magnetic element;
wherein the free layer has a saturation magnetization of not more than six hundred emu per cubic centimeter.

18. A magnetic element comprising:
a pinned layer;
a spacer layer;
a free layer, the free layer being ferrimagnetic and including at least one of a conductive ferrite, a garnet, a ferrimagnetic alloy excluding a rare earth, a heavy rare-earth transition metal alloy, a half-metallic ferrimagnet, and a bilayer including a rare earth transition metal alloy layer and a spin current enhancement layer residing between the rare-earth transition metal alloy layer and the spacer layer;
an additional spacer layer; and
an additional pinned layer, the additional spacer layer residing between the free layer and the pinned layer;
wherein the magnetic element is configured to allow the free layer to be switched using spin transfer when a write current is passed through the magnetic element; and
wherein the free layer includes the rare-earth transition metal alloy layer and wherein the free layer further includes
an additional spin current enhancement layer residing between the rare earth-transition metal alloy layer and the additional spacer layer.

19. A magnetic element comprising:
a pinned layer;
a spacer layer;
a free layer, the free layer being ferrimagnetic and including at least one of a conductive ferrite, a garnet, a ferrimagnetic alloy excluding a rare earth, a heavy rare-earth transition metal alloy, a half-metallic ferrimagnet, and a bilayer including a rare earth transition metal alloy layer and a spin current enhancement layer residing between the rare-earth transition metal alloy layer and the spacer layer;
an additional spacer layer; and
an additional pinned layer, the additional spacer layer residing between the free layer and the pinned layer;
wherein the magnetic element is configured to allow the free layer to be switched using spin transfer when a write current is passed through the magnetic element; and
wherein the additional pinned layer is a synthetic pinned layer including a first ferromagnetic layer, a second ferromagnetic layer, and a nonmagnetic conductive spacer layer residing between the first ferromagnetic layer and the second ferromagnetic layer.

20. The magnetic element of claim 19 wherein the pinned layer is a synthetic pinned layer and the additional pinned layer further includes a third ferromagnetic layer and an additional conductive spacer layer residing between the second ferromagnetic layer and the third ferromagnetic layer.

21. A magnetic element comprising:
a pinned layer;
a spacer layer;
a free layer, the free layer being ferrimagnetic and including at least one of a conductive ferrite, a garnet, a ferrimagnetic alloy excluding a rare earth, a heavy rare-earth transition metal alloy, a half-metallic ferrimagnet, and a bilayer including a rare earth transition metal alloy layer and a spin current enhancement layer residing between the rare-earth transition metal alloy layer and the spacer layer;
an additional spacer layer;
an additional pinned layer, the additional spacer layer residing between the free layer and the pinned layer;
wherein the magnetic element is configured to allow the free layer to be switched using spin transfer when a write current is passed through the magnetic element; and
wherein the at least one of the spacer layer and the additional spacer layer is an insulating barrier layer including at least one of crystalline MgO and alumina.

22. A magnetic element comprising:
a pinned layer;
a spacer layer;
a free layer, the free layer being ferrimagnetic and including at least one of a conductive ferrite, a garnet, a ferrimagnetic alloy excluding a rare earth, a heavy rare-earth transition metal alloy, a half-metallic ferrimagnet, and a bilayer including a rare earth transition metal alloy layer and a spin current enhancement layer residing between the rare-earth transition metal alloy layer and the spacer layer;
an additional spacer layer; and
an additional pinned layer, the additional spacer layer residing between the free layer and the pinned layer;
wherein the magnetic element is configured to allow the free layer to be switched using spin transfer when a write current is passed through the magnetic element
wherein the free layer includes the rare earth-transition metal alloy layer and the spin current enhancement layer; and wherein the free layer further includes:
an insertion layer between the rare earth-transition metal alloy layer and the spin current enhancement layer, the insertion layer including at least one of Ru, Rh, Ta, and Cr and having a thickness of not more than one nanometer.

23. A magnetic element comprising:
a pinned layer;
a barrier layer including at least one of alumina and crystalline MgO;
a free layer, the free layer being ferrimagnetic and including at least one of a conductive ferrite, a garnet, a ferrimagnetic alloy excluding a rare earth, a heavy rare earth-transition metal alloy, a half-metallic ferrimagnetic, and a bilayer including a rare earth-transition metal alloy layer and a spin current enhancement layer residing between the rare-earth transition metal alloy layer and the spacer layer, the rare earth-transition metal alloy layer including at least one of $CoRE_x$ and $(CoRE_j)Z_k$, where RE includes at least one of Gd, Tb, Dy, Ho, Em, and Tm and x is at least six percent and not more than thirty percent or $(CoRE_j)Z_k$, Z includes at least one of Au, Cu, B, Cr, and Mo, k is at least five and not more than forty percent, and j is at least ten and not more than thirty percent, the spin current enhancement layer including an alloy including at least one of Co, Ni, and Fe, the ferrimagnetic alloy including at least one of $Mn_2Sb$, $Mn_2Sn$, $Mn_3Ga$, $Mn_3Ge_2$, $Mn_3In$, $FeGe_2$, $FeSe$, $Cr_3As_2$, and $CrPt_3$, the heavy rare-earth-transition metal alloy including $RCo_5$ where R includes at least one of Gd, Tb, Dy, Ho, Eb, and Tm, the garnet includes Yttrium Iron Garnet, the conductive ferrite includes $Fe_3O_4$, the half-metallic ferrimagnet including at least one of $Co_2(Cr_{1-x}Fe_x)$ Al, $Co_2MnAl$, or $Co_2MnSi$, the free layer having a saturation magnetization of not more than six hundred emu per cubic centimeter;

wherein the magnetic element is configured to allow the free layer to be switched using spin transfer when a write current is passed through the magnetic element.

24. The magnetic element of claim 23 further comprising:
an additional spacer layer; and
an additional pinned layer, the additional spacer layer residing between the free layer and the pinned layer.

25. The magnetic element of claim 24 wherein the at least one of the spacer layer and the additional spacer layer is an insulating barrier layer including at least one of crystalline MgO and alumina.

26. The magnetic element of claim 24 wherein the free layer includes the rare-earth transition metal alloy layer and wherein the free layer further includes:
an additional spin current enhancement layer residing between the rare earth transition metal alloy layer and the additional spacer layer.

27. The magnetic element of claim 23 wherein the free layer further has lateral dimensions not more than two hundred nanometers.

28. The magnetic element of claim 23 wherein the free layer includes the bilayer including the rare earth transition metal alloy layer and the spin current enhancement layer residing between the rare-earth transition metal alloy layer and the spacer layer.

29. A magnetic memory comprising:
a plurality of magnetic elements, each of the plurality of magnetic elements including a pinned layer, a spacer layer, and a free layer, the free layer being ferrimagnetic and including at least one of a conductive ferrite, a garnet, a ferrimagnetic alloy excluding a rare earth, a heavy rare-earth-transition metal alloy, a half-metallic ferrimagnet, and a bilayer including a rare earth-transition metal alloy layer and a spin current enhancement layer residing between the rare-earth transition metal alloy layer and the spacer layer, each of the plurality of the magnetic elements being configured to allow the free layer to be switched using spin transfer when a write current is passed through the magnetic element;
wherein the spacer layer includes at least one of a barrier layer, a conductor and a nano-oxide layer; and
wherein the free layer further has lateral dimensions not more than two hundred nanometers.

30. A magnetic memory comprising:
a plurality of magnetic elements, each of the plurality of magnetic elements including a pinned layer, a spacer layer, and a free layer, the free layer being ferrimagnetic and including at least one of a conductive ferrite, a garnet, a ferrimagnetic alloy excluding a rare earth, a heavy rare-earth-transition metal alloy, a half-metallic ferrimagnet, and a bilayer including a rare earth-transition metal alloy layer and a spin current enhancement layer residing between the rare-earth transition metal alloy layer and the spacer layer, each of the plurality of the magnetic elements being configured to allow the free layer to be switched using spin transfer when a write current is passed through the magnetic element;
wherein the spacer layer includes at least one of a barrier layer, a conductor and a nano-oxide layer; and
wherein the free layer includes the bilayer including the rare earth transition metal alloy layer and the spin current enhancement layer residing between the rare-earth transition metal alloy layer and the spacer layer.

31. A magnetic memory comprising:
a plurality of magnetic elements, each of the plurality of magnetic elements including a pinned layer, a barrier layer including at least one of alumina and crystalline MgO, and a free layer, the free layer being ferrimagnetic and including at least one of a conductive ferrite, a garnet, a ferrimagnetic alloy excluding a rare earth, a heavy rare-earth-transition metal alloy, a half-metallic ferrimagnet and a bilayer including a rare earth-transition metal alloy layer and a spin current enhancement layer residing between the rare-earth transition metal alloy layer and the spacer layer, the rare earth-transition metal alloy layer including at least one of $CoRE_x$ and $(CoRE_j)Z_k$, where RE includes at least one of Gd, Tb, Dy, Ho, Em, and Tm and x is at least six and not more than thirty percent, k is at least five and not more than forty percent, and j is at least ten and not more than thirty percent, the ferrimagnetic alloy including at least one of $Mn_2Sb$, $Mn_2Sn$, $Mn_3Ga$, $Mn_3Ge_2$, $Mn_3In$, $FeGe_2$, $FeSe$, $Cr_3As_2$, and $CrPt_3$, the heavy rare-earth-transition metal alloy including $RCo_5$ where R includes at least one of Gd, Tb, Dy, Ho, Eb, and Tm, the garnet includes Yttrium Iron Garnet, the conductive ferrite includes $Fe_3O_4$, the half metallic ferrimagnet includes at least one of $Co_2(Cr_{1-x}Fe_x)Al$, $Co_2MnAl$, and $Co_2MnSi$, each of the plurality of the magnetic elements being configured to allow the free layer to be switched using spin transfer when a write current is passed through the magnetic element;
wherein the free layer further has lateral dimensions not more than two hundred nanometers.

32. A magnetic memory comprising:
a plurality of magnetic elements, each of the plurality of magnetic elements including a pinned layer, a barrier layer including at least one of alumina and crystalline MgO, and a free layer, the free layer being ferrimagnetic and including at least one of a conductive ferrite, a garnet, a ferrimagnetic alloy excluding a rare earth, a heavy rare-earth-transition metal alloy, a half-metallic ferrimagnet and a bilayer including a rare earth-transition metal alloy layer and a spin current enhancement layer residing between the rare-earth transition metal alloy layer and the spacer layer, the rare earth-transition metal alloy layer including at least one of $CoRE_x$ and $(CoRE_j)Z_k$, where RE includes at least one of Gd, Tb, Dy, Ho, Em, and Tm and x is at least six and not more than thirty percent, k is at least five and not more than forty percent, and j is at least ten and not more than thirty percent, the ferrimagnetic alloy including at least one of $Mn_2Sb$, $Mn_2Sn$, $Mn_3Ga$, $Mn_3Ge_2$, $Mn_3In$, $FeGe_2$, $FeSe$, $Cr_3As_2$, and $CrPt_3$, the heavy rare-earth-transition metal alloy including $RCo_5$ where R includes at least one of Gd, Tb, Dy, Ho, Eb, and Tm, the garnet includes Yttrium Iron Garnet the conductive ferrite includes $Fe_3O_4$, the half metallic ferrimagnet includes at least one of $Co_2(Cr_{1-x}Fe_x)Al$, $Co_2MnAl$, and $Co_2MnSi$, each of the plurality of the magnetic elements being configured to allow the free layer to be switched using spin transfer when a write current is passed through the magnetic element; and wherein the free layer includes the bilayer including the rare earth transition metal alloy layer and the spin current enhancement layer residing between the rare-earth transition metal alloy layer and the spacer layer.

33. A magnetic memory comprising:

a plurality of magnetic elements, each of the plurality of magnetic elements including a pinned layer, a spacer layer, and a free layer, the free layer being ferrimagnetic and including at least one of a conductive ferrite, a garnet, a ferrimagnetic alloy excluding a rare earth, a heavy rare-earth-transition metal alloy, a half-metallic ferrimagnet, and a bilayer including a rare earth-transition metal alloy layer and a spin current enhancement layer residing between the rare-earth transition metal alloy layer and the spacer layer, each of the plurality of the magnetic elements being configured to allow the free layer to be switched using spin transfer when a write current is passed through the magnetic element; wherein the spacer layer includes at least one of a barrier layer, a conductor and a nano-oxide layer; and wherein the rare-earth transition metal alloy layer includes at least one of $CoRE_w$ and $(CoRE_x)Z_y$, where RE includes at least one of Gd, Tb, Dy, Ho, Em, and Tm, Z includes at least one of Au, Cu, B, Cr, and Mo, w is at least six and not more than thirty percent, x is at least ten and not more than thirty percent, and y is at least five and not more than forty percent, and wherein the half metallic ferrimagnet includes at least one of $Co_2(Cr_{1-x}Fe_x)Al$, $Co_2MnAl$, and $Co_2MnSi$.

* * * * *